ELECTRICAL CONNECTOR

Filed Oct. 23, 1965 2 Sheets-Sheet 1

INVENTORS
ALAN W WILKERSON
RICHARD D. HORBINSKI
BY
Lieber & Nilles
ATTORNEYS

ELECTRICAL CONNECTOR

Filed Oct. 23, 1965 2 Sheets-Sheet 2

INVENTORS
ALAN W. WILKERSON
RICHARD D. HORBINSKI
BY
Lieber & Nilles
ATTORNEYS

United States Patent Office 3,378,806
Patented Apr. 16, 1968

3,378,806

ELECTRICAL CONNECTOR

Alan W. Wilkerson and Richard D. Horbinski, Thiensville, Wis., assignors, by mesne assignments, to Web Press Engineering, Inc., Addison, Ill., a corporation of Illinois Filed Oct. 23, 1965, Ser. No. 503,698
8 Claims. (Cl. 339—17)

ABSTRACT OF THE DISCLOSURE

An electrical connector for a base member containing an electrical circuit comprising a frame member having a portion connected to the electrical circuit and a portion forming a screw retaining means. A captive screw is mounted and retained in the screw retaining means to engage other connection means to form an electrical connection for the electrical circuit.

This invention relates to electrical connectors that may be used to connect various components or elements of an electrical circuit together.

For many years it was conventional to affix the electronic components of a radio, radar set, industrial control panel or the like to a metal chassis and to functionally connect them into an electrical circuit by soldering wires between them. While this system was satisfactory, it was extremely difficult and time consuming to exchange or replace components as it required unsoldering the connections to these components and removing them from the metal chassis, remounting the components and resoldering the connections.

More recently, electrical apparatus has been constructed by fastening small groups of functionally related components on a common base or mounting member and connecting the small groups together to form the completed electrical apparatus. For example, the groups of components may be mounted on insulating boards or blocks or may be encapsulated in a plastic resin. In the former instance, the connecting conductors are generally thin metal films affixed directly to the board or block rather than separate wires giving rise to the designation, "printed circuit boards." With encapsulated components, commonly called "modules," the components are wired together before encapsulation. The boards or modules are then placed in a rack or other device that positions them in adjacent relation. The external electrical connectors for these groups of components, necessary to interconnect them to form the complete electric apparatus, are generally located along one edge or end of the board or module, and the rack contains electrical connections or terminals that join with these connectors to provide an operative circuit.

The above construction provides an electrical apparatus that is easy to service and repair since, in the event of a defective or malfunctioning component, the entire printed circuit board or module containing such component may be disconnected and a replacement connected without disturbing the remainder of the apparatus. The board or module may then be separately repaired or discarded.

It may be readily appreciated that such ease of service and repair depends to a large extent on facilitating the connection and disconnection of the board or module, which in turn relies upon the electrical connectors employed. Obviously, the fundamental criteria for such electrical connectors include the ability to make good electrical and mechanical connections between the base member and the terminals on the rack. The latter is particularly important where the electrical apparatus is subjected to vibration. It is also necessary that such good electrical and mechanical connections be maintained through repeated connecting and disconnecting operations and that such repeated connection and disconnection be facilitated through easy access to the electrical connectors. It is desirable that the electrical connectors make it impossible to incorrectly connect the various boards or modules forming the electrical apparatus. Proper electrical insulation between adjacent connectors is also necessary in many types of apparatus. For servicing, it is desirable to permit the connectors to be utilized to take electrical measurements for determining deficiencies or malfunctioning in the components mounted on the boards or module. It is also desirable to have ease of access for such measurements in addition to the ease of access to permit connection and disconnection in an electrical apparatus. Finally, it is desirable to have a connection means that is self-contained and results in no loose parts or connection wires during the connection and disconnection of the base member.

Several types of electrical connectors for printed circuit boards or circuit modules exist in the prior art. One such type involves the use of a plated or foil covered area along the edge of the board or module that fits into a mating socket on the rack. Electrical and mechanical connection is generally maintained by means of a spring in the mating socket that grips the plated area upon connection. However, the use of such a connector has resulted in serious difficulties. Dirt or corrosion on the plated area or the socket and insufficient spring tension in the socket have contributed to poor electrical and mechanical connections by this type of connector. Corrosion has been partially eliminated by gold plating the area; however, this is, understandably, quite expensive. Additionally, repeated insertions of the board in the socket often wears out the gold plating, leaving the board again vulnerable to corrosion. As the plated areas are usually positioned on the edge of the board or module in a closely adjacent relationship, inadequate space exists for proper electrical insulation under high voltage conditions. Further, as the board is generally mounted in the rack by sliding it into the rack, the plated areas on the board and the sockets in the rack must be located in the rear so as to make connection when the board is completely inserted in the rack. This requires access to the rear of the rack for servicing or alterations to the electrical apparatus.

Another commonly employed electrical connector utilizes tabs extending from the board or encapsulated module in place of the foil covered or plated areas described above. Again, the tabs fit into a socket on the rack or mounting means and are held therein by means of a screw or spring-loaded mechanism. While this type of connector is not as prone to unsatisfactory operation due to dirt or corrosion, it does suffer the same failings in lack of proper electrical insulation for high voltage conditions and the necessity for access to the rear of the rack. In addition, the socket utilizing a screw for retaining the tab therein requires an even larger access area in order to tighten the screws. Excessive pressure applied by the screw to the tab often increases its lateral dimensions to the point where the tab cannot be withdrawn from the socket upon removal of the board from the rack.

A simple screw terminal is also often utilized to make electrical connections. Such a terminal may use a threaded lug mounted on the printed circuit board or encapsulated module. A connecting wire is wrapped around the screw and the screw inserted in the lug. However, to disconnect the board or module requires the removal of all the screws, resulting in a loose collection of pieces that may be easily lost, dropped into inaccessible places, or dropped into other electrical components in the apparatus, shorting or otherwise interfering with their operation. Additionally, the wires connected to the printed circuit board or encapsulated module by the screw terminals are loose when the screws are removed and may be incorrectly rewired upon reinsertion of another board or module.

The present invention, therefore, provides an electrical connector for an electrical component base or mounting member that provides good electrical and mechanical connections between the base and other portions of the apparatus. Such good mechanical and electrical connections are retained during repeated connections and disconnections of the components and during mechanical shock or vibration.

Further, the electrical connector of the present invention is constructed so as to permit easy access to the connectors to make electrical measurements or to allow connection or disconnection of the base member, such as a printed circuit board or encapsulated module.

The electrical connector is self-contained and utilizes no parts that are removed from the connector during connecting or disconnecting operations. Additionally, no wires or other conductors in the electrical apparatus need be loosened when employing the electrical connector of the present invention, thereby insuring correct connection of the base member to the apparatus. The invention, in one embodiment, may provide a keying means that further prevents incorrect connection of the circuit components.

The electrical connector of the present invention is simple and inexpensive to manufacture on existing equipment.

Briefly, the present invention provides for an electrical connector for a base member containing an electric circuit comprising a frame member having a portion connected to said electrical circuit and a portion forming a screw retaining means, and a screw member mounted and retained in the screw retaining means to engage other connection means to form an electrical connection for said electric circuit. The screw member may be termed a "captive screw" to indicate that it is not removable from the screw retaining means.

The invention, together with its construction, features, and operation, may be better understood by reference to the following specification and drawings, forming a part thereof, in which.

Figures 1, 2, 3:
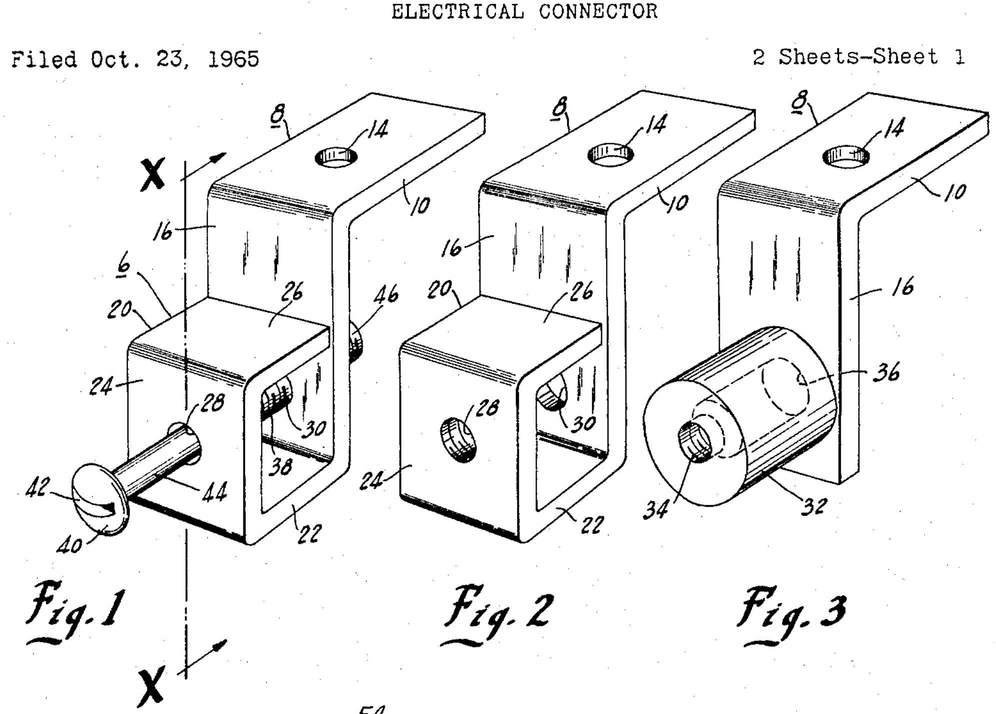
FIGURE 1 is a perspective view of the electrical connector of the present invention.
FIGURE 2 is a perspective view of the frame of the electrical connector of the present invention.
FIGURE 3 is a perspective view of an alternative embodiment of the frame of the electrical connector of the present invention.

Referring now to the figures and, specifically, to FIGURE 1, there is shown therein an electrical connector of the present invention, indicated by the numeral 6. The invention consists of a frame member 8 and a screw 38. The invention may be better understood by a study of the components of the electrical connector 6, and reference is made to FIGURES 2, 3, and 4 for this purpose.

In FIGURE 2 the connector frame is indicated by the numeral 8. The connector frame may be manufactured from sheet metal stock and comprises a portion 10, which is fastened to the common base member by means of rivet 12 extending through hole 14. By way of example, a printed circuit base board 15 is shown in FIGURES 5 through 9 having connectors 6 fastened to the underside thereof at intervals along one edge. However, it is to be understood that the invention is not solely limited in its use to such a structure but may be used with encapsulated components or other mounting means for the components. In addition mechanically fastening connector 6 to board 15, rivet 12 also electricaly connects connector 6 to the circuit of board 15 by bringing it into contact with the printed wiring 17 on the underside of board 15 adjacent the rivet.

Connector frame 8 has a portion 16, which terminates in a screw retaining loop 20. Specifically, loop 20 includes the lower part of depending portion 16, a bottom wall 22, a side wall 24, and a top wall 26. A pair of horizontally opposed holes 28 and 30 extend through the lower part of portion 16 and side wall 24. As may be seen from FIGURE 2, hole 28 is threaded. Hole 30 is unthreaded, and its diameter is in excess of the root diameter of the threads in hole 28.

FIGURE 3 shows an alternate embodiment of the connector frame shown in FIGURE 2, and similar parts are referred to by similar numerals. Instead of utilizing a loop 20, the embodiment of the connector frame shown in FIGURE 3 utilizes a solid, metallic structure 32 mounted on the lower end of depending portion 16 as a screw retaining means. While structure 32 is shown as cylindrical in FIGURE 2, it will be appreciated that other structures, such as a cube, may be employed. A threaded hole 34, corresponding to threaded hole 28 in the embodiment shown in FIGURE 2, is drilled in the outer end of structure 32 while a hole 36 is drilled through upstanding portion 16 and the inner end of structure 32. As before, the diameter of hole 36 must exceed the root diameter of the threads in hole 34.

Figure 4:
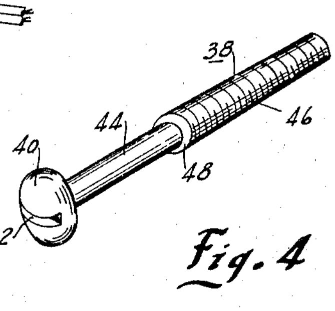
FIGURE 4 is a perspective view of the screw member of the electrical connector of the present invention.

Regardless of which embodiment of the invention is used, the screw member 38 shown in FIGURE 4 is employed therewith to form the completed electrical connector 6. Screw 38 includes a head portion 40 having a slot 42 therein, a shank portion 44, and a threaded portion 46. The threads of threaded portion 46 mate with the threads in holes 28 and 34. Shank portion 44 is sized so that its diameter is equal or less than the root diameter of the threads on threaded portion 46. It is therefore also less than the crest diameter of the threads on holes 28 and 34.

To assemble electrical connector 6, screw 38 is inserted in hole 28, of the embodiment of FIGURE 2, or hole 34, in the embodiment of FIGURE 3, and rotated until threaded portion 46 has passed completely through the aforementioned holes. The threaded portion is then contained in loop 20 or structure 32 while shank portion 44 rests in hole 28 or hole 34. As the diameter of shank portion 44 is less than the crest diameter of the threads on threaded portion 46, shank portion 44 does not engage the threads in holes 28 or 34. Screw 38 is thus free to move in a horizontal direction in loop 20 or structure 32 but cannot be withdrawn therefrom due to the interference between threaded portion 46 and the threads in holes 28 or 34. Hence, screw 38 may be termed a "captive screw." The screw 38 may, of course, be removed by rotating it so that threaded portion 46 passes back through holes 28 or 34.

Figures 5, 6, 8:
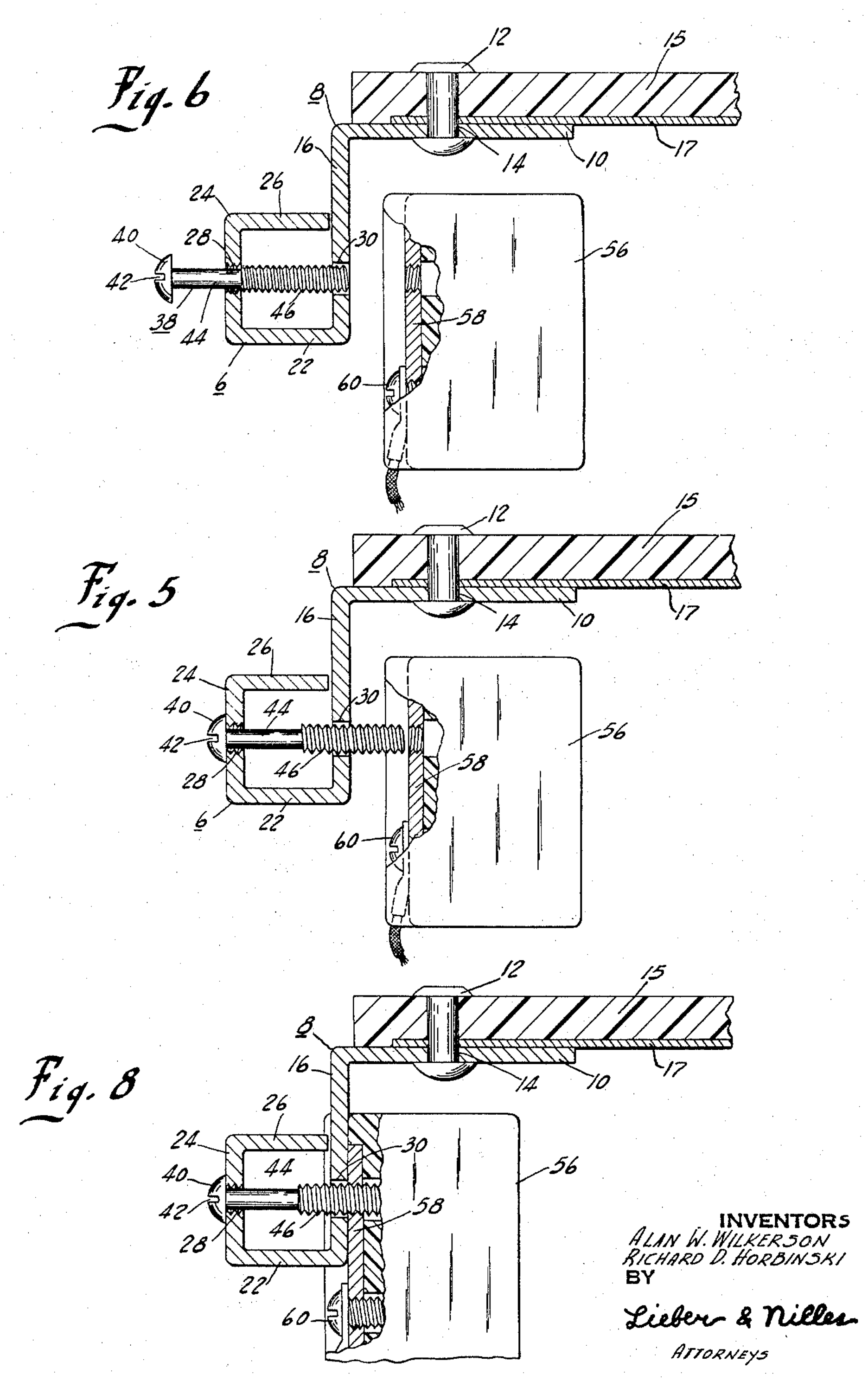
FIGURE 5 is a cross sectional view of the electrical connector of the present invention taken along the line *x—x* of FIGURE 1.
FIGURE 6 is also a cross sectional view of the electrical connector of the present invention taken along the line *x—x* of FIGURE 1.
FIGURE 8 is a cross sectional view showing the electrical connector and the terminal block.

To provide satisfactory operation of the electrical connector, the length of shank portion 44 should be such that when head 40 is resting on side wall 24 or the outer end of cylinder 32, only threaded portion 46 extends through hole 30 or hole 36 as shown in FIGURE 5. In the other extreme, when screw 38 is retracted to the fullest extent, that is, when initial threads 48 of threaded portion 46 abut the inner end of hole 28 or hole 34, the threaded portion 46 should not extend through hole 30 or hole 36. This presents a flush surface along depending portion 16 which aids in the employment of connectors. This position is illustrated by FIGURE 6. However, particularly in the embodiment of the invention using the frame 8 shown in FIGURE 2, the lower end of threaded portion 46 should remain partially in hole 30 so as to retain screw 38 in alignment with the two holes in loop 20 or structure 32. While a screw 38 having a thread of standard pitch is shown in the figures, it will be appreciated that a thread form with a coarser pitch may be applied to screw 38 to provide a "quick fastening" characteristic to the connector.

The use of electrical connector 6 may be illustrated by reference to FIGURE 7 which shows portions of a printed circuit board mounting rack 50. The rack consists of a plurality of upright members 52 to which are fastened printed circuit board guides 54 which retain printed circuit board 15. A terminal block 56 is mounted on upright members 52 immediately below printed circuit board 15. These terminal blocks may be of any commonly available type; the one shown in FIGURE 7 being that manufactured by the Cinch Manufacturing Co., Division of United-Carr Fastener Corp., Chicago, Ill. and designated a Cinch-Jones Type 141 terminal block. The terminal block consists of a plurality of metal strips having a threaded hole at each end. The lower hole of strip 58 is used to fasten the external connection to printed circuit board 15 by means of screws 60. The upper hole is adapted to engage screw 38.

When printed circuit board 15 is inserted in guides 54, depending portion 16 abuts metal strip 58 and screw 38 is in alignment with the upper hole of strip 58. Screw 38 is then rotated into the upper hole to bring depending portion 16 into firm contact with metal strip 58 to complete the connecting operation. See FIGURE 8. A similar operation is performed for each of the electrical connectors 6 along the edge of printed circuit board 15.

Figure 7:
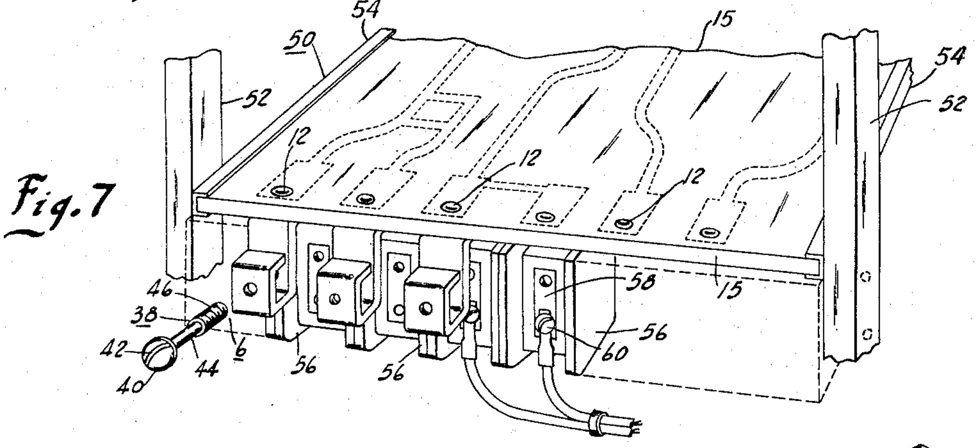
FIGURE 7 is the view showing the electrical connector employed to connect a printed circuit board to the terminal block of a mounting rack.

While the use of a rack and terminal block configuration is shown in FIGURE 7, it is to be understood that the use of the invention is not limited to such a configuration. Electrical connector 6 may be used to connect circuit components to other types of available connectors, directly to other circuit components, or to other printed circuit boards or encapsulated modules.

It will be appreciated that the above described electrical connector 6 retains all the advantages of a screw type electrical connector, including the fact that it is permanent, vibration resistant, and provides good electrical contact. Additionally, the present invention provides further advantages in allowing removal of the printed circuit board or other circuit component mounting means without disturbing other wiring in the electrical apparatus. Electrical measurements, requiring the use of instruments fitted with spring clips, may be easily accomplished as loop 20 or structure 32, and the associated screw 38, provide a readily available means on which to affix the clips. Also, screw 38 is captive in loop 20 or structure 32 and is retained in electrical connector 6 during connection and disconnection of the printed circuit board 13.

Figure 9:
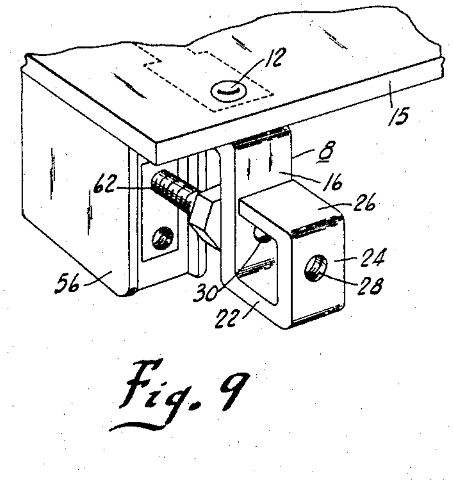
FIGURE 9 is a detailed view showing a means for preventing insertion of the incorrect printed circuit board on a mounting rack.

FIGURE 9 shows how the present invention may be adapted to prevent insertion of the wrong printed circuit board 15 in the instance where numerous printed circuit boards are to be inserted in one rack. A stud 62 may be inserted in one of the holes of metal strip 58 so that it abuts depending portion 16 of any electrical connector 6 that is attempted to be connected to the terminal containing the stud. This will alert one inserting printed circuit board 15 in the rack that he is attempting to insert a board that is not designed to be connected to that terminal block 56. Further, stud 72 may extend a sufficient distance to prevent a connection of any other electrical connectors 8 fastened to the same printed board 15.

On the other hand, it is a simple matter, on the board designed to be mated with a given terminal block 56, to omit the connector 6 adjacent stud 62 and to place it elsewhere on the board. This permits printed circuit board 15 to be inserted in the rack without interference from stud 62. A similar keying arrangement may be developed for each printed circuit board to be inserted in the rack so that only the correct board for a given terminal block may be inserted in rack 50 without interference from stud 62.

It is not necessary that portion 16 depend as shown in the figures. Portion 16 may, if desired, be coplanar with portion 10 or at an angle thereto. Further, it is not necessary that loop 20 be rectangular. If necessary it may be triangular or open ended in the form of a U.

Other modifications and embodiments are contemplated, and it is desired to include all such modifications and embodiments as come within the scope of the attached claims.

We claim:

1. An electrical connector for connecting an electrical circuit base to an electrical terminal having a threaded hole, said connector comprising:

an elongated, electrically conductive frame member having one end portion with means for connecting it to the base and a second end portion, spaced from said one end portion and carrying a screw retaining means adapted to retain a partially threaded screw for freely slidable and limited axial movement, said frame member having a surface abuttable with said electrical terminal; and a partially threaded screw retained in said screw retaining means and axially movable to extend through said abuttable surface and into threaded engagement with said threaded hole to bring said surface into abutment with said terminal when said screw is tightened, said partially threaded screw having a shank portion and a portion containing threads, said screw retaining means comprising a structure containing a pair of axially aligned holes spaced apart in a direction extending away from said electrical terminal, one of said holes presenting an opening smaller in diameter than the crest diameter of the threads on said screw, the other of said holes being of a diameter greater than the crest diameter of the threads on said screw, whereby said screw is retained in said screw retaining means by positioning said shank portion in said one of said holes and said portion containing threads in the other of said holes, the length of the portion containing threads being such as to permit said screw to be retracted into said screw retaining means to present a flush surface abuttable with said electrical terminal.

2. The electrical connector of claim 1 wherein said frame member is formed of an elongated strip of metal and said screw retaining means includes one end of said strip bent to form a structure having spaced opposite portions with said axially aligned holes in said opposite portions.

3. The electrical connector of claim 2, wherein said structure is in the form of a rectangular loop.

4. The electrical connector of claim 1, wherein said structure is solid with said axially aligned holes extending therethrough, said structure being mounted on said frame member opposite said surface abuttable with said electrical terminal.

5. The electrical connector of claim 1 in combination with a base containing an electrical circuit, said connector mounted on the edge of said base and connected to said electrical circuit.

6. The combination as set forth in claim 5, further characterized in that said base is a printed circuit board.

7. Electrical apparatus comprising a base carrying electrical circuits terminating along an edge thereof, electrical terminals connectable to said electrical circuits, said terminals having threaded holes, and electrical connectors fastened along said edge of said base for connecting said electrical circuits to said terminals, each of said connectors comprising an elongated, electrically conductive frame member having one end portion fastened to said edge of said base and connected to said electrical circuits and a second end portion, spaced from said one end portion and carrying a screw retaining means adapted to retain a partially threaded screw for freely slidable and limited axial movement, said frame member having a surface abuttable with one of said electrical terminals; and a partially threaded screw retained in said screw retaining means and axially movable to extend through said abuttable surface and into threaded engagement with one of said threaded holes in said terminals to bring said surface into abutment with said one of said terminals when said screw is tightened to make an electrical connection between said electrical circuits and said one of said terminals, said partially threaded screw having a shank portion and a portion containing threads, said screw retaining means comprising a structure containing a pair of axially aligned holes spaced apart in a direction extending away from said one of said electrical terminals, one of said holes presenting an opening smaller in diameter than the crest diameter of the threads on said screw, the other of said holes being of a diameter greater than the crest diameter of the threads on said screw, whereby said screw is retained in said screw retaining means by positioning said shank portion in said one of said holes and said portion containing threads in the other of said holes, the length of the portion containing threads being such as to permit said screw to be retracted into said screw retaining means to present a flush surface abuttable with said electrical terminals.

8. The electrical apparatus of claim 7 including a means for preventing incorrect connection of said electrical circuits to said electrical terminals, said means comprising a means operatively associated with said terminals to prevent said screws from engaging the holes in said terminals.

References Cited

UNITED STATES PATENTS

| | | | |
|---|---|---|---|
| 1,927,780 | 9/1933 | Anderson | 151—69 X |
| 2,232,857 | 2/1941 | Jackson | 339—272 |
| 2,510,339 | 6/1950 | Heiss | 339—186 X |
| 2,882,513 | 4/1959 | Olashaw | 339—198 |
| 3,041,913 | 7/1962 | Liska | 151—69 |
| 3,195,600 | 7/1965 | Middleton | 151—69 |

FOREIGN PATENTS

| | | |
|---|---|---|
| 4,731 | 10/1931 | Australia. |
| 626,118 | 8/1961 | Canada. |

MARVIN A. CHAMPION, *Primary Examiner.*

PATRICK A. CLIFFORD, *Assistant Examiner.*